United States Patent
Horzel et al.

(10) Patent No.: US 6,251,756 B1
(45) Date of Patent: Jun. 26, 2001

(54) FURNACE FOR CONTINUOUS, HIGH THROUGHPUT DIFFUSION PROCESSES FROM VARIOUS DIFFUSION SOURCES

(75) Inventors: Jörg Horzel, Heverlee; Jozef Szlufcik, Kessel-Lo; Johan Nijs, Linden-Lubbeck, all of (BE)

(73) Assignee: Interuniversitair Micro-Elektronica Centrum (IMEC vzw), Leuven (BE)

( * ) Notice: Subject to any disclaimer, the term of this patent is extended or adjusted under 35 U.S.C. 154(b) by 10 days.

(21) Appl. No.: 09/614,643

(22) Filed: Jul. 12, 2000

Related U.S. Application Data

(62) Division of application No. 09/064,648, filed on Apr. 22, 1998, now Pat. No. 6,117,266.
(60) Provisional application No. 60/044,596, filed on Apr. 22, 1997.

(30) Foreign Application Priority Data

Dec. 24, 1997 (EP) .................................................. 97122885

(51) Int. Cl.$^7$ .................................................. H01L 21/04
(52) U.S. Cl. ......................................... 438/510; 438/907
(58) Field of Search ................................ 438/558, 565, 438/537, 510, 907, 562

(56) References Cited

U.S. PATENT DOCUMENTS

| | | | |
|---|---|---|---|
| 3,615,944 | * 10/1971 | Sheng et al. | 438/565 |
| 3,656,720 | 4/1972 | Westeren et al. | 432/122 |
| 4,525,224 | * 6/1985 | Vlasak | 438/565 |
| 4,745,088 | 5/1988 | Inoue et al. | 117/98 |
| 4,803,948 | 2/1989 | Nakagawa et al. | 118/725 |
| 4,950,156 | 8/1990 | Philipossian | 432/253 |
| 5,449,883 | 9/1995 | Tsuruta | 219/483 |
| 5,527,389 | 6/1996 | Rosenblum et al. | 118/58 |
| 5,641,214 | * 6/1997 | Kafka | 305/180 |
| 5,641,707 | * 6/1997 | Moslehi | 438/513 |
| 6,083,833 | * 7/2000 | Ahn | 438/674 |
| 6,117,266 | * 9/2000 | Horzel et al. | 156/345 |

FOREIGN PATENT DOCUMENTS

| | | |
|---|---|---|
| 0 387 097 A1 | 9/1990 | (EP) . |
| 0 489 179 A1 | 6/1992 | (EP) . |

* cited by examiner

Primary Examiner—John F. Niebling
Assistant Examiner—Stacy Whitmore
(74) Attorney, Agent, or Firm—Knobbe Martens Olson & Bear LLP

(57) ABSTRACT

An open apparatus is described for the processing of planar thin semiconductor substrates, particularly for the processing of solar cells. The apparatus includes a first zone for the drying and burn-out of organic components from solid or liquid based dopant sources pre-applied to the substrates. The zone is isolated from the remaining zones of the apparatus by an isolating section to prevent cross-contamination between burn-out zone and the remaining processing zones. All the zones of the apparatus may be formed from a quartz tube around which heaters are placed for raising the temperature inside the quartz tube. Each zone may be purged with a suitable mixture of gases, e.g. inert gases such as argon, as well as oxygen and nitrogen. The zones may also be provided with gaseous dopants such as $POCl_3$ and the present invention includes the sequential diffusion of more than one dopant into the substrates. Some of the zones may be used for driving-in the dopants alternatively, for other processes, e.g. oxidation. The present invention also includes a method of operating the apparatus and the use of the apparatus in processing solar cells.

4 Claims, 6 Drawing Sheets

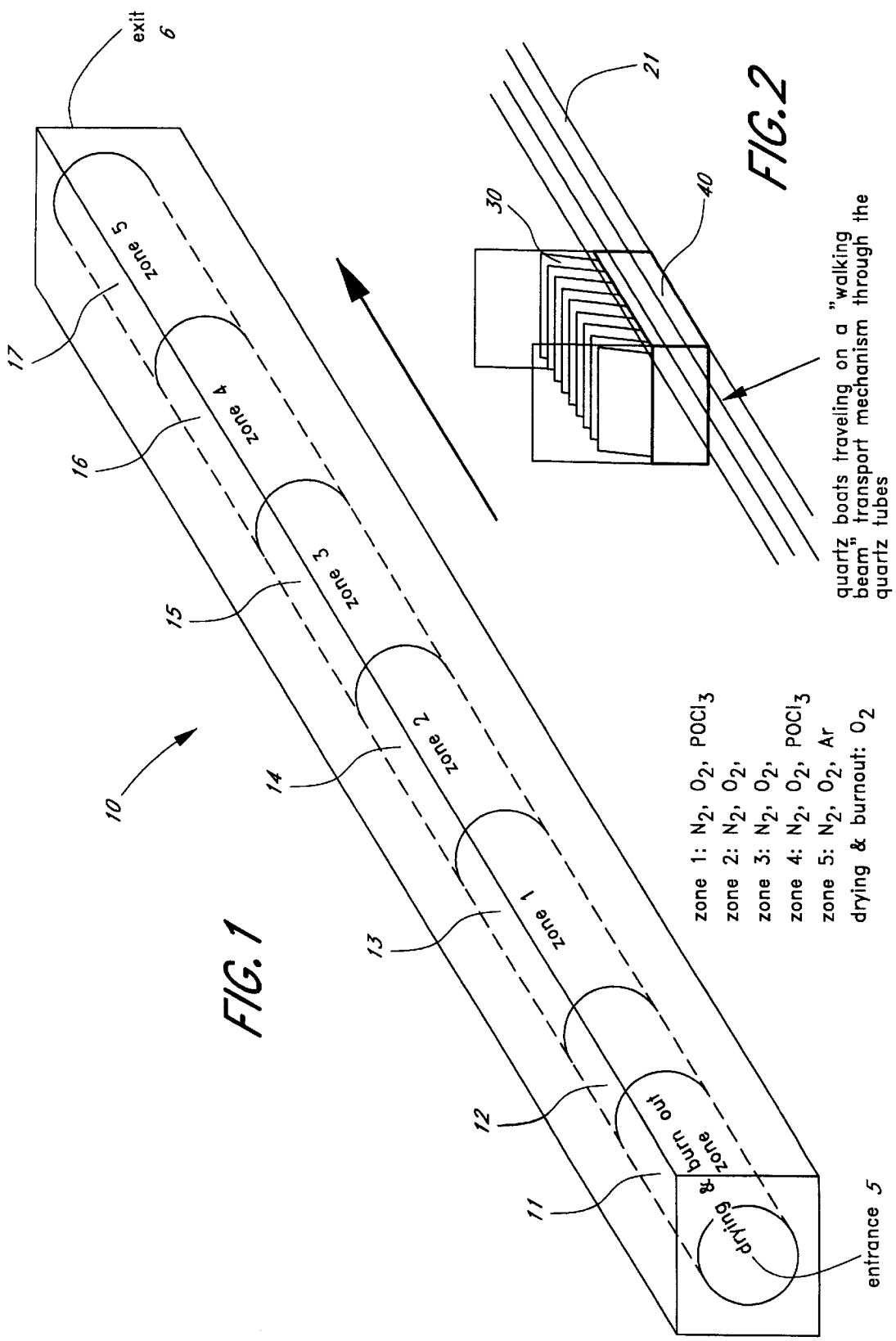

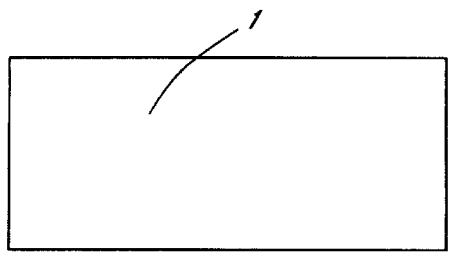
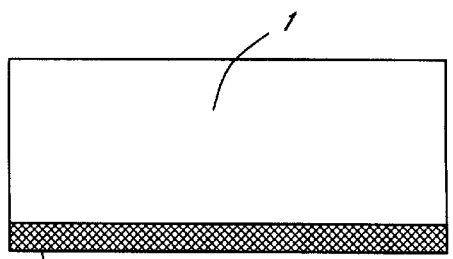
FIG.7A          FIG.7B
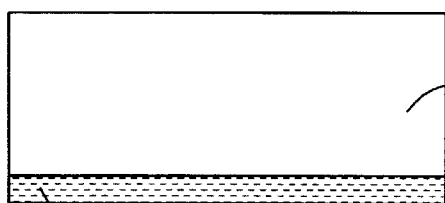
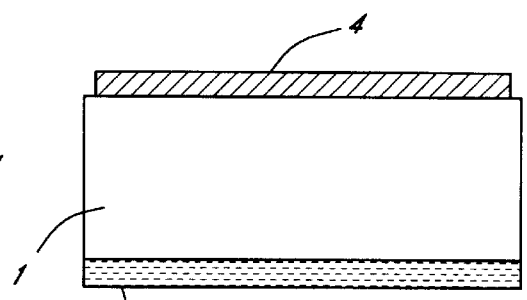
FIG.7C          FIG.7D
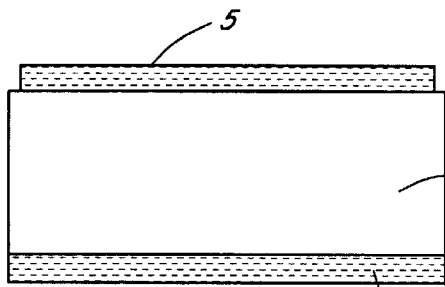
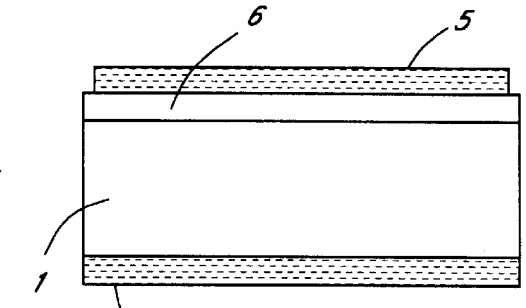
FIG.7E          FIG.7F
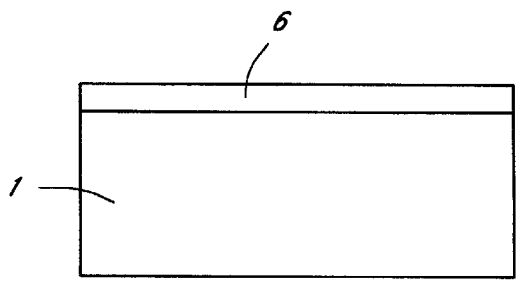
FIG.7G

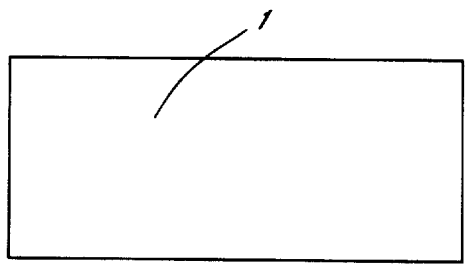
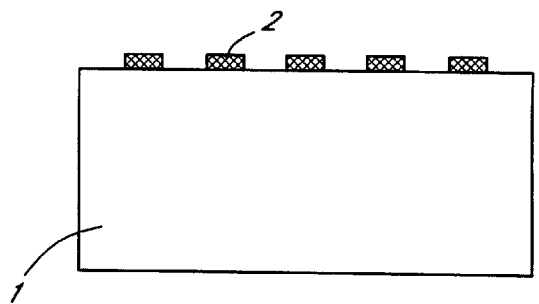
FIG.8A　　　　FIG.8B
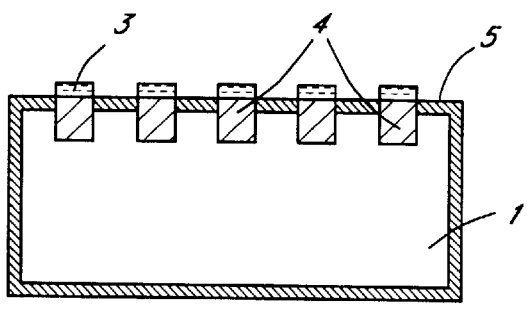
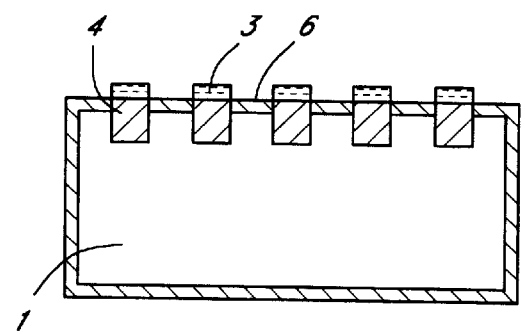
FIG.8C　　　　FIG.8D
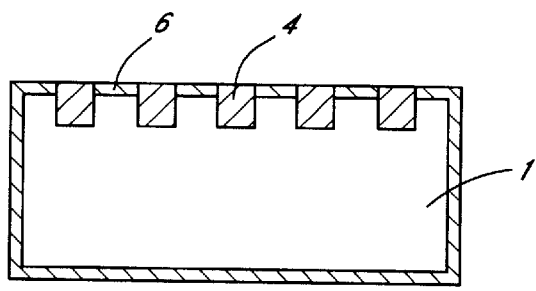
FIG.8E

FURNACE FOR CONTINUOUS, HIGH THROUGHPUT DIFFUSION PROCESSES FROM VARIOUS DIFFUSION SOURCES

RELATED APPLICATIONS

This application is a divisional application of U.S. patent application Ser. No. 09/064,648, filed Apr. 22, 1998 now U.S. Pat. No. 6,117,266, which claims priority from a U.S. Provisional Patent Application No. 60/044,596, filed Apr. 22, 1997 and which claims priority from European Patent Application No. 97122885.3, filed Dec. 24, 1997, in the European Patent Office.

BACKGROUND OF THE INVENTION

1. Field of the Invention

The present invention relates to an apparatus for continuous processing of a thin planar semiconductor substrate, in particular to an open continuous diffusion furnace as well as a method of operating the same for the processing and production of semiconductor devices, in particular for the processing and production of solar cells.

2. Background of the Invention

Known solar cell fabrication processes such as described in U.S. Pat. No. 5,527,389 using a liquid based diffusion source previously applied to a semiconductor substrate make use of open conveyor belt furnaces. On the other hand vertical or horizontal closed quartz tube furnaces are typically used for diffusion from gaseous sources in the batch manufacture of semiconductor devices as described, for instance in U.S. Pat. No. 4,745,088 or U.S. Pat. No. 4,950,156. Batch manufacture is slow because of the set-up times between each batch. Attempts have been made to achieve continuous or semi-batch processing of semiconductors but all these commercially available diffusion systems yield a throughput lower than required for the future needs of the solar cell industry.

SUMMARY OF THE INVENTION

The present invention provides an apparatus for open processing of thin planar semiconductor substrates, comprising: a first part for high temperature removal of organic components from the substrates; and a second part having a plurality of processing zones, said second part being locally isolated from said first part to prevent contamination of said second part by volatile products from said first part, each zone of said second part being suitable for executing a step of a processing sequence, each zone including means for providing a gas ambient therein and for being heated to a specific temperature; and a transporter for transporting the substrates through said first and said second parts in a substantially continuous horizontal movement. Preferably, the transporter is adapted so that the area of substrates transferred per unit time exceeds the area swept by the transporter per unit time. The present invention includes use of the above apparatus for the processing of solar cells.

The present invention also provides a method of open processing of thin planar semiconductor substrates, comprising a plurality of sequential high temperature processing steps including: high temperature removal of organic components from said substrates, and further high temperature processing steps; said further high temperature processing steps being locally isolated from said organic component removal step to prevent contamination of said further high temperature processing steps by volatile products from said organic component removal step; and transporting said substrates through said plurality of sequential high temperature processing steps on a substrate carrier in a substantially continuous horizontal movement. Preferably, the area swept by the transporter in unit time is less than the area of substrates transported in a unit time.

The substrates are preferably stacked horizontally or vertically in the substrate carriers. This achieves a higher throughput than the conventional flat processing of wafers.

The apparatus in accordance with the present invention may comprise several processing zones after the burn-out zone, for example four zones, the gas ambient of the first zone comprising a gaseous diffusion source for doping said substrate and an inert gas and oxygen, the gas ambient of the second zone comprising an inert gas and oxygen, the gas ambient of the third zone comprising a gaseous diffusion source for doping said substrate and an inert gas and oxygen, and the gas phase ambient of the fourth zone comprising an inert gas and oxygen. The system is open, i.e. in contact at least indirectly with the ambient atmosphere around the apparatus. The open system preferably does not include vacuum traps or air-tight compartments.

The open continuous diffusion system that will be described in the following yields a high throughput and gives a variety of advantages over existing diffusion systems. As for conveyor belt furnaces, the system allows for the application of liquid or solid based diffusion sources such as screen printing of a phosphorous paste prior to the diffusion process. The drying and burn-out of organic components in a first part of the furnace is locally separated from the high temperature diffusion regions of the furnace in order to avoid contamination. Unlike conveyor belt furnaces, the substrates are preferably not placed horizontally on a moving belt in accordance with the present invention. The substrates are preferably loaded into quartz boats in such a way that the throughput is increased compared to the conventional flat arrangement of the wafers. For instance, the wafers may be stacked vertically or horizontally in the boats. This avoids contamination from particles on the belt and particles that might fall on the substrate surface. The vertical or horizontal stacked arrangement of the wafers in the present invention increases the throughput of the system for a given speed of the transportation mechanism. Both diffusion from solid and liquid dopants as well as sequential doping from a gaseous atmosphere may be provided by the inventive system. A variety of advantageous processes can be performed that are not possible in conventional diffusion systems. Especially when a selective diffusion is performed in only one diffusion step, the described innovative system gives additional freedom in the processing conditions.

The present invention provides a system that can be used for continuous diffusion processes by providing a furnace with several zones that can be heated individually and purged individually with various gas atmospheres. The substrates to be processed are moved sequentially through these different zones. The substrate loading and unloading occurs at locally different positions, preferably at the entrance and the exit of the system. The substrates are typically semiconductor wafers and are preferably placed vertically in quartz boats in order to avoid any direct contact with the transport mechanism. Preferably, the mechanical contact area in the slots of the clean quartz boats is reduced to a minimum. The transport of the quartz boats itself occurs ideally by a mechanism that does not create particles or any contamination in the furnace, e.g. by a walking beam. The vertical or horizontal stacks of substrates yield several advantages:

A considerably higher throughput for the same system size as compared to conventional conveyor belt furnaces can be achieved, i.e. the total area of substrates transferred per unit time exceeds the area swept by the transport means per unit time;

The substrate surfaces are protected from particles that might fall into the furnace (at exhaust outlets for instance);

Wafers can be loaded back to back in the same slot for cases in which only one major surface of the substrate to be diffused in this processing step. This minimises unwanted indirect diffusion of the back sides and doubles the throughput;

The substrate surfaces on which diffusion occurs are positioned parallel and preferably facing each other. The spacing between those surfaces can be varied in order to actively regulate the indirect diffusion from the ambient gas phase where substrates are only selectively covered with a diffusion source. The closer the spacing the higher the concentration of the doping atoms that diffuse out from the source that was applied to the substrate into the ambient gas surrounding the substrates.

The major surfaces of the substrates only touch any part of the transport mechanism on the edges thereof. Further, the edges of the substrates only touch removable and cleanable substrate carriers rather than being placed flat on a conveyor belt which first of all makes contact with one major surface of the substrate and secondly may be contaminated from previous processing steps.

The innovative diffusion furnace allows further to have an active deposition from a gaseous diffusion source in one or several zones. This provides increased process flexibility and allows choice of a variety of continuous high throughput diffusion processes:

a) The system can be used for a continuous diffusion process from gaseous diffusion sources yielding a high throughput. Deposition from a gaseous source can be done at temperatures below the real diffusion temperature to yield a more homogeneous diffusion over the whole substrate surface. By injecting a gaseous diffusion source at several positions in the diffusion sequence it is possible to vary the depth profile of the dopant concentration after diffusion (diffusion depth profile) more easily. For instance, diffusion with a low dopant concentration but a deep diffusion depth may be carried out in the beginning of the process sequence and a very shallow diffusion with high surface concentration added towards the end of the sequence. This is of particular interest for solar cell processes where screen printed contacts require such diffusion depth profiles.

The system allows further for processes that selectively apply a protective coating or mask prior to the application of an organic doping paste to parts of the substrate. This mask layer can prevent diffusion into the semiconductor substrate. This coating or masking layer can be for instance a thick oxide layer that is formed when burning out the organic materials from the paste. The organic components are burned out in the drying and burn-out zone at the beginning of the furnace and do not contaminate the later clean diffusion zones of the furnace.

b) The system can be used as a conventional conveyor belt furnace for diffusion from liquid or solid diffusion sources as for instance screen printable phosphorous paste. The organic components of these diffusion sources are burned out in the drying and burn-out zone at the beginning of the diffusion sequence. The substrates are in their vertical position in quartz boats much better protected from contamination (belt, falling particles, etc.) than in conventional belt furnaces while the throughput is clearly increased.

c) The system is very much suited for processes where selective diffusions occur from a diffusion source that is applied to parts of the substrate on the one hand and by out-diffusion of dopant atoms from this diffusion source into the gas atmosphere and re-entry at places of the substrate that are not protected by the source or any other layer (indirect or passive diffusion). Also for these selective diffusion processes a high throughput can be achieved. Additionally there is the possibility of manipulating the indirect diffusion via the gas atmosphere by choosing the spacing between the processed substrates. This spacing has an influence on the concentration of doping atoms in the gas atmosphere surrounding the substrates and therefore on the level of indirect doping in the substrate.

d) The system also allows the combination of diffusion from liquid or solid diffusion sources that are pre-applied to the substrate with a gaseous diffusion into other substrate areas that obtained no pre-applied coating of a diffusion source or other masking layers. Consequently it is also possible to have diffusions of opposite types of dopant atoms going on in the same process sequence. The additional use of a gaseous diffusion source gives a large degree of freedom for selective diffusion processes in which the different diffusion areas can then be manipulated substantially independently of each other.

The use of such a system is further not limited to diffusion only. Simply by switching the atmosphere of the different zones to oxygen it can be used for a continuous oxidation process. It is also possible to have an oxidation performed directly after diffusion in the same processing sequence. Further it is possible to add a chemical vapour deposition (CVD) step within the same oven to provide CVD coatings at the end of the processing sequence by having the corresponding gas atmospheres in the last zone(s) of the system.

The invention includes a continuous processing system that allows loading of substrates at one place in the system and to unload them at another place in the system and that is further most suited to perform diffusions from liquid, solid and/or gaseous diffusion sources in a continuous sequence. At least four high throughput processes may be provided for semiconductor processing. The first part of the sequence includes a drying and burn-out zone which is locally separated from the other zones in the sequence, where organic components of liquid or solid diffusion sources are burned out in an oxygen containing atmosphere while the other zones can be purged with shielding inert gases (e.g. nitrogen or argon), or with oxygen or other gasses, whereby in one or two zones a deposition from a gaseous diffusion can be performed, all zones having high temperature heating means for externally heating quartz tubes. A first process may be a continuous diffusion from a liquid or solid diffusion source that is pre-applied to the substrates and pre-dried, the substrates being stacked vertically or horizontally in clean carriers such as quartz boats followed by moving these carriers through a drying and burn-out zone with a oxygen containing atmosphere at temperatures ranging from 300–700° C., and then through a further zone or zones that are purged with an inert gas at temperatures typically between 600 and 1200° C., e.g. 800° C. Optionally further zones may be provided that may be purged with oxygen. Diffusion into the substrates may occur at all places to which the diffusion source was applied. A second a continuous diffusion process from a gaseous diffusion source (such as POCl3) may be included whereby the substrates are maintained in a vertical or horizontal position in contamination free carriers such as quartz boats and where the gaseous diffusion source can be doped into the substrate in one or more subsequent zones of the continuous process that may be separated and/or followed by zones that allow drive-in of the dopant atoms from the diffusion source into the substrate in an inert gas atmosphere. A third process may be a continuous diffusion process which will be described later in more detail where the substrates are placed vertically or horizontally into contamination free carriers such as quartz boats, whereby all three processes may allow for the application of an organic based protection mask that prevents diffusion at the places of the substrates to which it was applied and whose organic components are burned out in the first part of the system in a drying and burn-out zone in an oxygen rich atmosphere. A fourth process may be a continuous high throughput oxidation process where a thermal oxide is grown on the semiconductor substrate.

The dependent claims define further embodiments of the invention. The invention, its advantages and embodiments will now be described with reference to the following drawings.

DESCRIPTION OF THE DRAWINGS

FIGS. 1–2 show schematic views of the apparatus and the wafer transfer mechanism in accordance with an embodiment of the present invention.

FIGS. 6–8 show schematic representations of a diffusion process in accordance with the present invention.

DETAILED DESCRIPTION OF THE PREFERRED EMBODIMENTS

Figure 3:
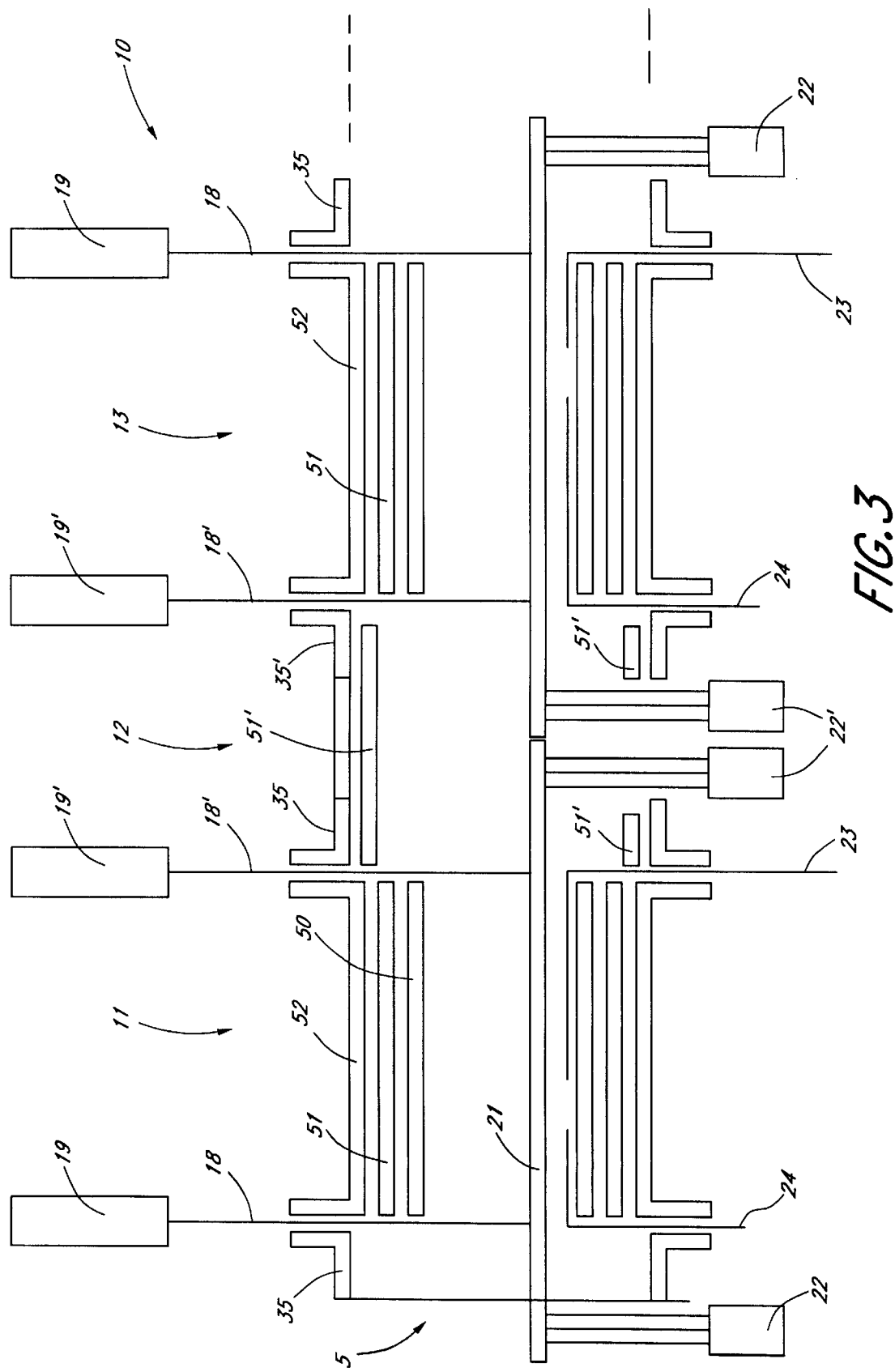
FIGS. 3–4 show schematic longitudinal and traverse cross-section representations of an apparatus in accordance with another embodiment of the present invention.

The present invention will be described with reference to certain embodiments with reference to specific drawings but the invention is not limited thereto but only by the claims. In particular, the present invention will be described with reference to solar cells for which it is particularly suited, but the invention is not limited thereto but may find general application in processing semiconductor substrates.

The present invention relates to equipment for semiconductor processing that can be used for several advantageous high throughput diffusion processes. FIGS. 1A and 1B show simplified views of the furnace 10 and a substrate carrier 40 in accordance with the present invention including the innovative diffusion system. The furnace may include:

A first processing zone 11 that can be used for drying and/or burning out of all organic components from diffusion source or masking layers that are pre-applied to the wafer substrates 30. Organic components from diffusion or masking sources that were applied to the substrates 30 are burned out in this zone in an oxygen containing atmosphere at temperatures ranging from 300–750 degree C. and most preferably at around 500 degree C. The first zone 11 is locally isolated from the other zones by a section 12 of the furnace 10 in order to avoid any cross contamination between the first zone 11 and the other zones 13 to 17 and vice versa. This isolation may be achieved by appropriate purging and exhaustion of the section 12. The conditions in section 12, e.g. temperature and gas atmosphere may be controlled to provide the optimum starting condition for the next zone 13 in the sequence. In particular, the conditions in section 12 should preferably be controlled to prevent degradation of the fused dopant after the burnt-out zone 11, e.g. when phosphorus paste is used as the solids based dopant source for pre-application to substrates 30, it is preferably to prevent contact with moisture vapour in section 12.

The substrates 30 move after burn-out through an isolation section 12 into a zone 13 that can be filled and purged with inert gases, with oxygen or optionally with a gaseous diffusion source. This zone 13 can be regulated to the appropriate temperature depending on whether diffusion should already occur in this zone or whether it is used only as deposition and/or temperature ramp-up zone. Zone 13 can be independently filled and purged with an inert gas and/or oxygen, and can be heated to temperatures at which diffusion of dopant atoms into the substrate occurs, typically ranging from 850 to 1000 degree C.

The substrates 30 move through further zones 14 to 17 that can be independently filled and purged with an inert gas and/or oxygen, and that can be heated to temperatures at which diffusion of dopant atoms into the substrate occurs, typically ranging from 850 to 1000 degree C.

Each processing zone 11–17 may surrounded by a protection tube which is preferably inert, can withstand high temperatures and is easy to clean, e.g. a single or several quartz tubes 50 throughout the length of the apparatus 10. The heating of the quartz tube 50 may occur via conventional heating elements around the quartz tube 50 or via the conversion of light from IR lamps into heat on a coating at the outside of the tube 50. Where isolation between the different zones is necessary to prevent cross-contamination, this may be achieved by a suitable isolating section 12 between the zones and/or an adapted exhaust system that regulates the gas pressure conditions in the zones correspondingly, in particular the flow of inert shielding gases around the substrates 30. Each of these zones 13–17 may be followed by another zone that can be purged by a gaseous diffusion source, by inert gases and/or by oxygen. Consequently, a later zone or zones can be used to provide a second diffusion from a gaseous source in order to create, for instance, a high dopant surface concentration on a very shallow part of an emitter region towards the end of the diffusion sequence. This zone may be followed by further zones that can be purged by inert gases and/or oxygen and that can be heated to a temperature at which diffusion occurs.

The heating zones 13–17 may allow deposition from a gaseous diffusion source introduced into the zones. These diffusion zones 13–17 may be advantageously placed towards the beginning and towards the end of the sequential diffusion sequence. This allows superimposition of two different depths of dopant penetration (diffusion depth profile) by a homogeneous continuous gaseous diffusion or to add only a shallow diffusion depth profile for a selective diffusion process at those areas to which no solid or liquid diffusion source has been applied. For example, zone 11 may be used for drying and burn-out of organic materials from the solids-based dopants selectively pre-applied to substrates 30. Zone 13 may be a diffusion zone purged with a mixture of nitrogen, oxygen and a gaseous dopant such as $POCl_3$ for deposition of the second dopant. Zones 14 and 15 may be purged with oxygen and nitrogen and may be used to drive-in the dopants. Zone 16 may be a further diffusion zone which is purged with nitrogen, oxygen and a gaseous dopant such as $POCl_3$ for a further deposition of a third dopant. Zone 5 may be purged with nitrogen and oxygen and may be used for driving-in the third dopant.

The system includes a contamination free transport system 21 for substrate carriers 40 such as quartz boats. The transport mechanism 21 moves the carriers continuously through all zones 11–17 including isolation sections 12. Although the present invention does not exclude a conveyor belt, the transport mechanism 21 should preferably be free of contamination as can be achieved for instance with a 'walking beam' mechanism. A walking beam mechanism for use in a furnace is known from U.S. Pat. No. 5,449,883 in which horizontal wafer substrates are lifted and moved in the processing direction using two sets of rods that reach through heated zones of the system. Adapting this mechanism to the present invention, the substrate carriers 40 (e.g. quartz boats) are lifted up by a first set of two or more parallely spaced carbide or quartz rods that reach through each quartz tube and the rods are moved forward before they are lowered below a second set of two or more carbide or quartz rods thus handing over the substrate carrier 40 to the second set. The second set again lifts up the carriers 40 and moves them forwards handing over to the first set again which has been returned to its neutral position in the meantime, and so on. This transport mechanism 21 does not create any contaminating particles in the diffusion system itself. The movement mechanism for the rods may be located outside the quartz tube. For very long ovens the movement mechanism may be provided in the isolation zones between processing zones. The walking beam mechanism described above does not create particles by friction (as produced by rollers and a conveyor belt for instance) and does not contain metal parts in the heating zone, i.e. no possibility of metal contamination at the high temperatures used in the zones. Further, the only parts which are transported between zones are the carriers 40 and the substrates 30 whereas with a conveyor belt parts of the transport mechanism also pass between the zones thus transferring contaminating substances between zones. In accordance with the present invention, cross-contamination between zones is reduced to a minimum.

Figure 5:
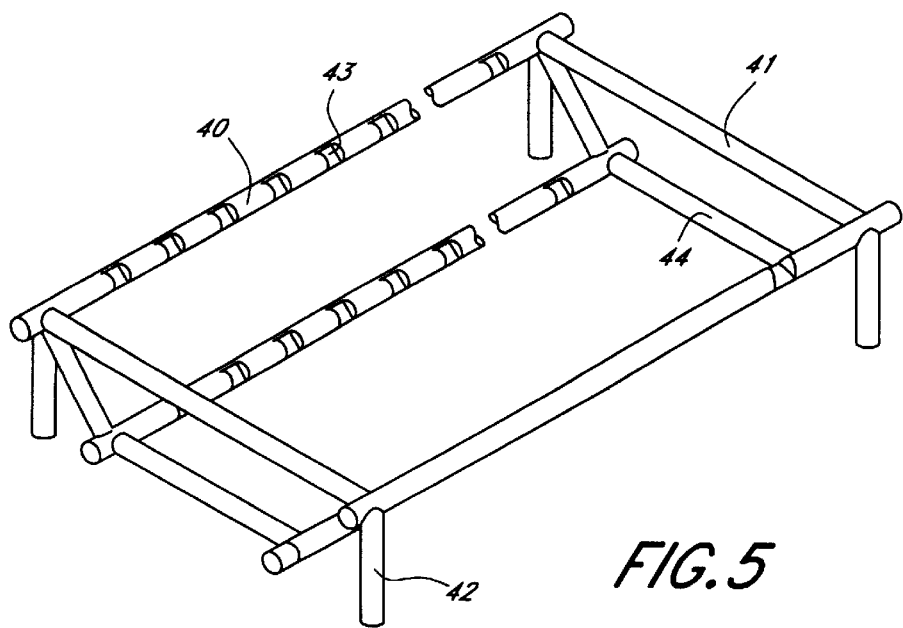
FIG. 5 shows a substrate carrier suitable for use with the present invention.

The substrates 30 are preferably loaded into the quartz boats 40 in such a way that a higher throughput is achieved compared with other continuous diffusion equipment such as conveyor belt furnaces with horizontally arranged wafers. In particular, the substrates 30 may be stacked a vertically or horizontally, one above the other, or at an inclination to the vertical. When stacked vertically, the substrates 30 may be stacked with the plane of the substrates in the transport direction or at an angle thereto. A suitable carrier 40 is shown schematically in FIG. 5. Ideally the carrier 40 should have thin support members 40, 41, 42, 44 to allow free access of gas to the wafers 30. The wafers 30 should make minimal contact with the carrier 40, e.g. by being located in slots 43 which they touch only at their edges in order to reduce contamination and disturbance of the temperature distribution on the wafer substrates 30 to a minimum. The vertical position of the substrates 30 has the advantages that the major surfaces of the substrates 30 do not touch a possibly contaminated part of the system and that particles cannot fall onto these surfaces. The substrates 30 can be loaded back to back into the same slot 43 of the carrier 40 reducing the parasitic diffusion on the back side of each substrate 30 and doubling the throughput per boat 40. The spacing between substrate surfaces that were selectively coated by a liquid and/or solid based diffusion source, can be varied easily by changing the design of the boats 40. This spacing determines the volume of gas between the substrates 30 which determines the concentration of dopant atoms that diffuse out of the diffusion source into the gas atmosphere between the two substrate surfaces. The substrates 30 may also be arranged vertically with the surfaces coated with dopant facing the uncoated side of the next substrate 30. During drive-in of the dopant, the dopant atoms released into the gas atmosphere between the substrates 30, diffuse indirectly into the uncoated surfaces of the substrates 30 resulting in a floating junction on the reverse side of the substrate at the same time as selective diffusion on the front side of the substrate 30 from the selectively applied dopants. The gas flow inside the several zones 11–17 is designed to be homogeneous over the substrate surfaces. The conditions from substrate to substrate are the same because the substrates 30 experience the same conditions sequentially one after each other. A system that is designed in this way allows for a variety of different continuous diffusion processes with the high throughput needed for future high volume solar cell production lines.

The substrates 30 are loaded and unloaded at different positions (entrance 5, exit 6). The substrates 30 move continuously in the vertical or horizontally position in carriers 40 through several zones 11–17 of the diffusion system before they are unloaded at another place 6 than they were loaded 5.

The system in accordance with the invention can be used, for instance, for the following processes:

1) a continuous diffusion process from a liquid or solid diffusion source that is applied to the substrates 30. Possibilities to apply the diffusion are for instance thick film techniques like screen printing that apply a diffusion paste or a spray or spin-on of a liquid diffusion source. The source is dried and organic components are burned out in the first zone 11 of the continuous system as in conventional conveyor belt furnaces. For the burn-out an oxygen rich atmosphere is used and temperatures around 500 degree or even up to 700 degree will burn out all organic components without starting diffusion or oxidation. The substrates 30 then enter several high temperature zones 13–17 that are purged by an inert gas such as nitrogen and/or oxygen. The temperature in these zones 13–17 can range from 800 to 1100 degree C. and typically from 850 to 1000 degree in order to diffuse the dopant atoms from the source layer into the substrates 30. The vertical positioning of the substrates 30 yields a much higher throughput for the proposed system as compared to conventional belt furnace where the substrates are placed horizontally. Further, the substrates 30 are only touching the quartz boats 40 in which they are positioned at their edges. The transport mechanism 21 itself consists only of contamination free materials like silicon carbide or quartz that can withstand temperatures as high as 1100 degrees. The vertical position of the substrates 30 further reduces the risk of contamination from particles that might be falling on the substrate surfaces if these were placed horizontally. The proposed diffusion system provides consequently a cleaner diffusion process and a substantially increased throughput as compared to existing diffusion systems from liquid and/or solid based diffusion sources.

2) a continuous diffusion process from gaseous diffusion sources. In that case the burn-out section 11 is only important if an organic based diffusion mask was applied to parts of the substrate surfaces. In that case the burn out would be performed as described under 1). In the other case this zone might be even switched off. The first zone 13 after the burn-out section is purged with a gaseous diffusion source in order to deposit a doped film on the substrate surface 30. The temperature in this zone can be as low as 750 degree in order to deposit a relatively thick film from the source without starting diffusion yet. This allows for a more homogeneous diffusion in the following drive-in zones. However it is also possible to have already temperatures around 900 degree in order to start with the diffusion process at the same time as the deposition is done if the source is in injected in a way that results in homogeneous conditions over the substrate 30. The deposition zone is followed by drive-in zones 14–17 in which the dopant atoms diffuse from the deposited film inside the substrate at temperatures that are typically ranging from 850 to 1000 degree C. These diffusion zones 14–17 are typically purged by an inert gas such as nitrogen. This first diffusion from an gaseous diffusion source might be followed by a second deposition zone. In this deposition zone another time a gaseous diffusion source is deposited on the substrates. Typically the temperature is maintained high enough that diffusion occurs (atypically 900 to 1000 degree C.) but it is also possible to deposit the diffusion glass again at temperatures at which no diffusion occurs yet (below 800 degree C.) in order to yield higher homogeneity over the substrate surface. The last zones are then again drive in zones that are typically purged with an inert gas like nitrogen and that are typically heated to temperatures around or above 900 degree C. The deposition and drive-in from a gaseous diffusion source at two different places of the diffusion system gives more freedom in determining the diffusion depth profile (dopant atom concentration versus depth in the substrate). It gives for instance the possibility to create a relatively deep diffusion with lower dopant atom concentration in the first sections of the system and to superimpose a very shallow dopant profile with high surface concentration in the end part of the diffusion system. Such profiles can be more easily optimised as for instance in the case of silicon solar cells where screen printed metallisation is used to contact a phosphorous doped emitter. The metallisation will require in that case an emitter profile that is deep enough to avoid shunting when the metal contact is formed and with high surface concentration of dopant atoms that allows to form a good ohmic contact. On the other hand the emitter should not be highly doped over the whole depth because this would result in worse performance of the solar cells as in the case where the emitter is formed in the described way by two depositions.

Further, it is possible to have in the end zones after depositing the gaseous source an oxygen atmosphere at temperatures above 800 degree that results in an thermal oxidation of the substrate. This thermal oxide can serve as a defect passivating layer in the surface region. Joining oxidation and diffusion in one process step simplifies the processing sequence and additionally avoids chemical steps in between these two process steps.

Principally the described process sequence can be performed in a batch type system with a closed quartz tube. The advantages of the proposed system are a much higher throughput, a continuous process and the additional possibility of using organic based diffusion masks.

3) a continuous selective diffusion process as described later. After a pattern of a liquid or solid based diffusion source is applied selectively to part of the substrate surfaces these substrates 30 pass a drying and burn-out section 11 as described under 1) in order to remove all organic components from the diffusion source. The following zones 13–17 will typically be at elevated temperatures at above 900 degree C. in an inert gas atmosphere. At the same time two diffusion processes will start. Dopant atoms diffuse out of the diffusion source into the underlying substrate 30. Additionally dopant atoms diffuse from the selectively applied source into the gas phase and from there into the substrate 30 at those places to which no diffusion source was applied. The concentration at which the diffusion atoms re-enter the substrate is highly dependent on the gas volume between neighbouring substrates 30 that should be placed parallel to each other in vertical position in the quartz boats 40 having the surfaces with applied diffusion source facing each other. The spacing between two substrates 30 can consequently be chosen in order to influence this indirect diffusion. If the diffusion source was applied to only one substrate side it is possible to load the substrates back to back in the same slot 43 in order to minimise indirect diffusion from the gas phase on the back sides. The possibility to deposit a gaseous diffusion source with the proposed system gives another degree of freedom to manipulate the diffusion on those substrate areas that were not covered by a diffusion source. Consequently the process allows to form on the same substrate two or more different diffusion regions nearly independently in only one diffusion process. The same advantages as described under 1) hold for this process with the additional advantage of more freedom in the selective diffusion as compared to systems where substrates cannot be placed parallel to each other, where no gaseous diffusion source can be injected in addition, where no burnt-out zone is provided or where there is no contamination free transport mechanism.

With the possibility to purge oxygen in all zones of this innovative system it can also be used for a continuous thermal oxidation process with high throughput. The different zones are then typically heated to temperature ranging from 800 to 1000 degree C.

Figure 4:
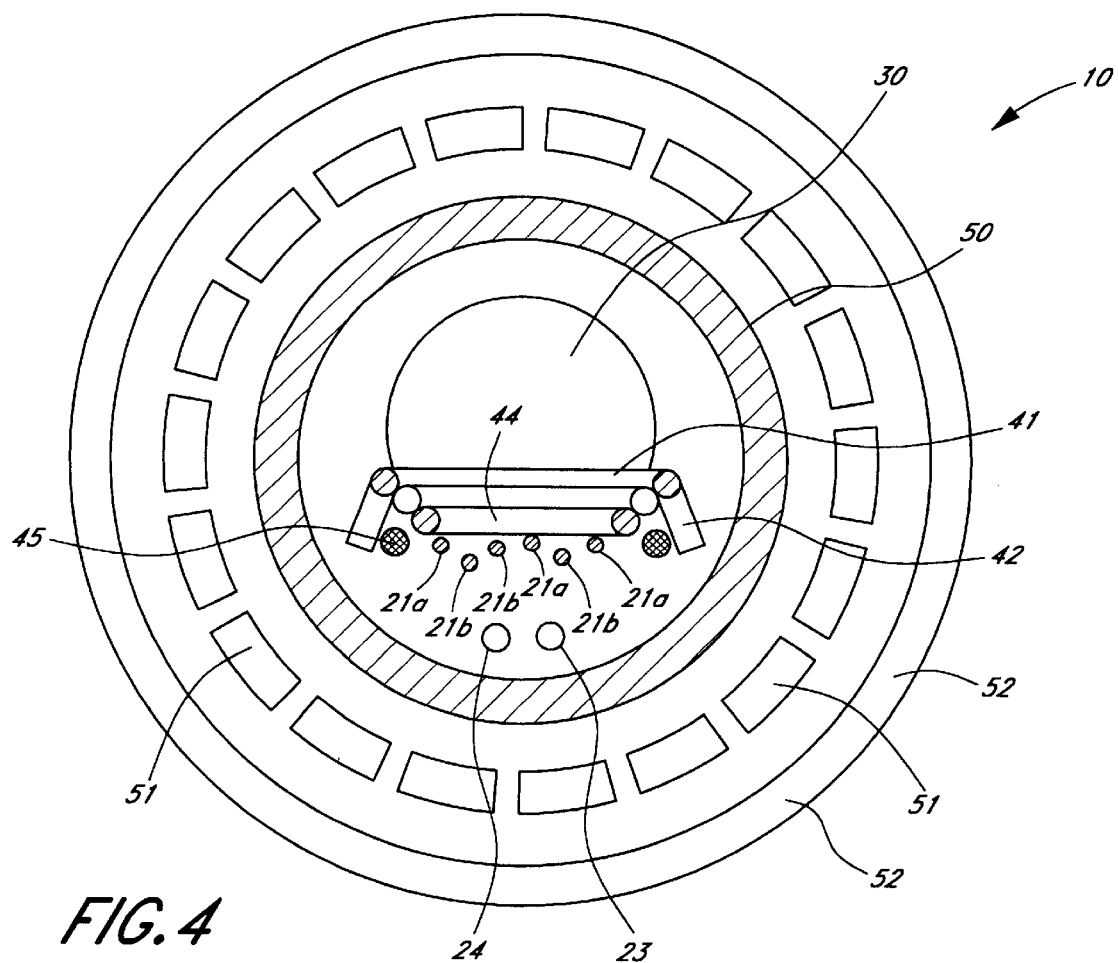

A further embodiment of the present invention will be described with reference to FIGS. 3 and 4. FIG. 3 shows a schematic longitudinal cross-section through a furnace 10 in accordance with the present invention. Only zones 11 to 13 are shown however, further zones 14 to 17 may be added as required. FIG. 4 shows a schematic transverse cross-section through one of the zones 11, 13–17 of the furnace 10. The furnace 10 includes an outer jacket 52 preferably thermally insulated. Within the jacket are placed heaters 51 for heating a quartz tube 50. The heaters 51 may be contact, convection or radiation heaters, e.g. infra-red heaters. Preferably, the heaters 51 are segmented into discretely controllable sections and the temperature within each quartz tube may be controlled by suitable temperature sensors and controllers, e.g. as known in principle from U.S. Pat. No. 5,449,883. Within each quartz tube 50, a walking beam transport mechanism 21 is provided. The mechanism 21 may be formed from continuous rods stretching from one end of the apparatus 10 to the other and be driven by suitable drivers 22 located at the beginning and end of apparatus 10. Optionally, additional drivers 22' may be placed at intermediate points, e.g. within isolation sections 12. The mechanism 21 includes at least 4 rods 21a, 21b which run throughout the length of a quartz tube 50 and are segregated into two sets 21a; 21b. The wafer carrier 40 is supported and transported by one of the sets 21a and 21b at any time. Fixed quartz guide rods 45 may be provided to prevent the quartz boats 40 from slipping sideways. For very long ovens the rods may be segmented, e.g. at the end of each quartz tube 50 one set of rods from the previous quartz tube may overlap with a set of rods from the next quartz tube allowing continuous transfer from one zone to another.

Gas may be introduced or exhausted from each quartz tube 50 by means of a plurality of tubes 23, 24 of which only two are indicated in FIGS. 3 and 4. To maintain the atmosphere and ambient temperature constant in each quartz tube, sliding doors 18 operated by actuators 19 may be provided at the entrance and exit of the oven, alternatively and optionally also intermediate doors 18' with actuators 19' may be provided at the end of each quartz tube 50. These need not seal off the ends of tubes 50 completely because of the transport mechanism 21, but provide a considerable reduction in the open exit and entry areas thus reducing the load on exhaust and purging equipment. To provide further isolation between sections, large diameter air curtains 35 may be provided optionally at the beginning and end of each zone 11, 13–17 or sections 12 in order to prevent cross-contamination between the zones. A large diameter air curtain suitable for use with heat processing apparatus is known from U.S. Pat. No. 4,803,9548. The isolation sections 12 are preferably made long enough to receive at least one boat 40. This allows both doors 18 to be closed at each end of the isolation section 12 followed by purging of this section to remove contaminating gasses before the boat 40 moves into the next processing zone. The conditions within the isolation section 12, e.g. temperature and gas atmosphere are preferably controlled to provide the optimum starting conditions for the next zone 13. For example isolation section 12 may contain heaters 51' and the gasses entering the isolation section 12 as well as all the other zones 11, 13–17 may be pre-heated.

In FIG. 4 the wafers 30 are shown vertically mounted and perpendicular to the direction of transport however, the invention is not limited thereto. The wafers 30 may be positioned parallel to the movement direction, in which case it is preferable to use a quartz tube 50 with a quadratic section. Alternatively, the wafers 30 may be stacked one above another horizontally, with the last wafer preferably being protected by a sheet of material to prevent falling particles from landing on the upper wafer 30.

Figure 6A:
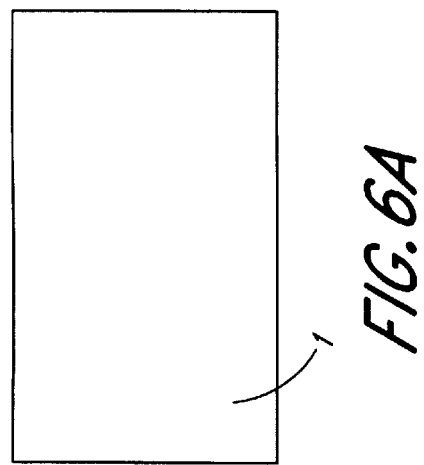
Figure 6B:
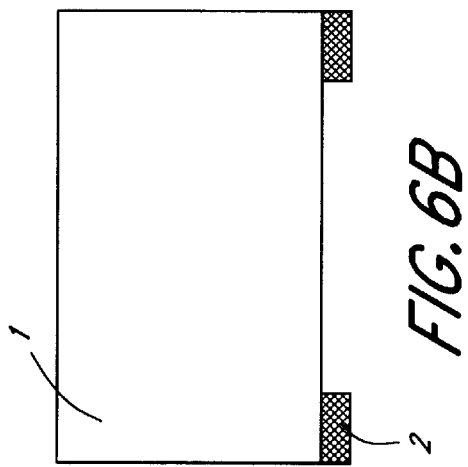
Figure 6C:
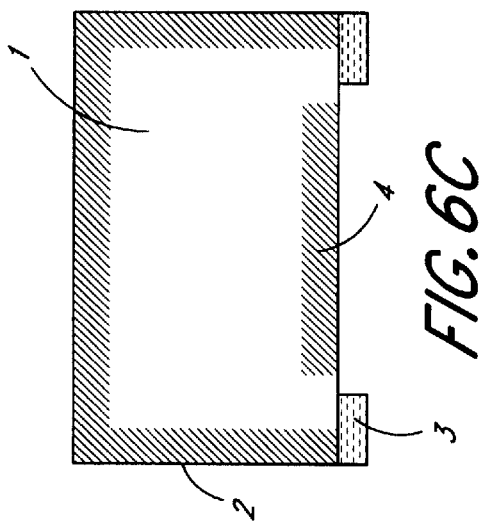
Figure 6D:
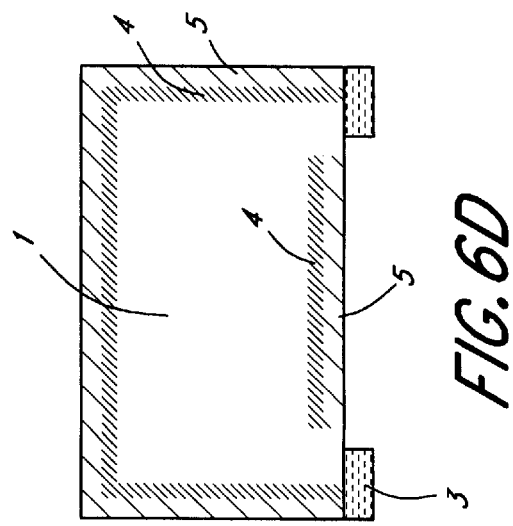
Figure 6E:
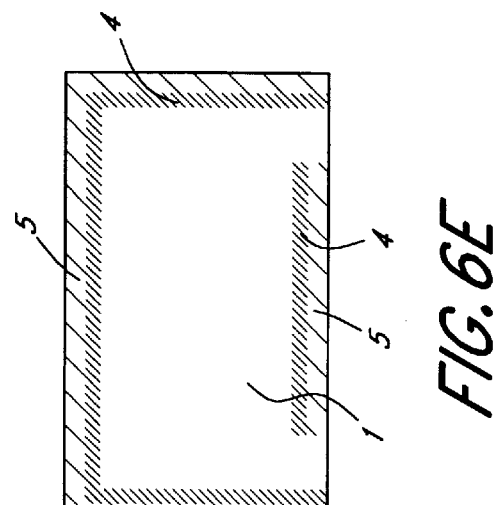

FIGS. 6A to E show schematically a continuous homogeneous diffusion process from a gaseous diffusion source. Before loading the semiconductor substrate 1 to the diffusion system, a masking layer 2 may be applied to some areas of the substrate 1 (FIG. 6B). In the burn-out section 11 of the diffusion system the organic components of the masking layer are burned out. The resulting layer 3 serves then as mask for diffusion from a gaseous source. A diffused layer 4 is formed at all places that are not protected by the mask (FIG. 6C). A second injection of a gaseous diffusion source towards the end of the process can lead to a modified diffusion region 5 in the part of the diffused region 4 near the surface (FIG. 6D). After unloading the substrates 1, the masking layers are removed from the places where no diffusion occurred (FIG. 6E).

FIGS. 7A to G show schematically a continuous, homogeneous diffusion process from a liquid or solid based diffusion source. Optionally a masking layer 2 may be applied to parts of the semiconductor substrate 1 and dried in a separate dryer FIGS. 7B and C). To the substrate 1 with the dried masking layer 3, a liquid or solid based diffusion source 4 is applied (FIG. 7D). All organic components of this layer 4 and 3 are burned out in the burn-out section 11 of the described innovative diffusion system (FIG. 7E). As the substrate 1 reaches the diffusion zones 13–17 that are typically purged by an inert gas such as nitrogen and heated to temperatures above 900 degrees, dopant atoms from the dried modified diffusion layer 5 diffuse into the underlying substrate 1 and create a diffusion region 6 (FIG. 7F). Not shown in this figure is that at the same time at regions that are not protected by the diffusion source 5 or the masking layer 3, a weak diffusion can occur via an out-diffusion of dopant atoms of the diffusion source 5 into the surrounding gas atmosphere. After removing the masking layer 3 and the diffusion source 5 the substrate 1 shows a diffused layer 6 at all places to which the diffusion source 5 was applied (FIG. 7G).

FIGS. 8A to E show schematically a continuous selective diffusion process. Two or more differently doped regions can be achieved at the same time by intentionally using the effect that dopant atoms diffuse out of the liquid or solid based diffusion sources into the gas atmosphere and re-enter from there into the substrate where this is directly exposed to that gas atmosphere. First a pattern of a diffusion source 2 is applied selectively to parts of the semiconductor substrate 1 using techniques such as, for instance, screen printing of a diffusion paste (FIG. 8B). When the substrate 1 passes the burn-out section 11 of the diffusion system, all organic components of the diffusion source 2 are burned out resulting in diffusion source layer 3 from which dopant atoms diffuse in the following diffusion zones 13–17 at a relatively high concentration into the underlying substrate 1, creating diffusion regions 4. At the same time diffusion takes also place at other places 5 that obtained no diffusion source coating (FIG. 8C). This diffusion comes from dopant atoms that first diffuse into the gas surrounding the diffusion source 3 and from there back into the semiconductor substrate 1. The rate at which the indirect diffusion via the gas atmosphere occurs depends on the spacing between neighbouring substrates 1 in the quartz carriers 40 because this determines the dopant concentration in the gas volume around the substrates 1. The indirectly doped regions 5 are usually shallower and weaker doped than the regions 4 under the diffusion source 3. It is possible to influence the diffusion at those regions more easily by inserting a gaseous diffusion source in one or several zones 13–17 of the continuous diffusion process resulting in a diffused layer 6 (FIG. 8D). This process allows optimisation of the diffusion regions 4 and 6 nearly independently from each other. After the diffusion, the source layer 3 is usually removed from the substrate 1 (FIG. 8E).

While the invention has been described with reference to preferred embodiments, it will be understood by those skilled in the art that various changes or modifications in form and detail may be made without departing from the scope and spirit of this invention.

What is claimed is:

1. A method of open processing of thin planar semiconductor substrates, comprising a plurality of sequential high temperature processing steps including:

high temperature removal of organic components from said substrates;

further processing of said substrate at high temperature, said further high temperature processing being locally isolated from said organic component removal step to prevent contamination of said high temperature processing by volatile products from said organic component removal step; and transporting said substrates through said plurality of high temperature processing steps on a substrate carrier in a substantially continuous horizontal movement.

2. A method according to claim 1, wherein the area swept by said substrate carrier in unit time is less than the area of substrates transported in a unit time.

3. A method according to claim 1, wherein said further high temperature processing includes providing a gas ambient comprising gaseous diffusion sources for doping the substrates.

4. A method according to claim 1, further comprising the step of depositing a liquid or solid based diffusion source material on the semiconductor substrates before the step of high temperature removal of organic components, the diffusion source material including the organic components.

* * * * *